US007075093B2

(12) United States Patent  
Gorski et al.

(10) Patent No.: US 7,075,093 B2  
(45) Date of Patent: Jul. 11, 2006

(54) PARALLEL MULTI-ELECTRON BEAM LITHOGRAPHY FOR IC FABRICATION WITH PRECISE X-Y TRANSLATION

(76) Inventors: Richard M. Gorski, 206 E. Maude Ave., Arlington Heights, IL (US) 60004; Boris Rozansky, 440 Buckhorn Ter., Buffalo Grove, IL (US) 60089; Hsing-Yao Chen, 222 Bride Path Ct., Fox River Grove, IL (US) 60021

( * ) Notice: Subject to any disclaimer, the term of this patent is extended or adjusted under 35 U.S.C. 154(b) by 135 days.

(21) Appl. No.: 10/844,201

(22) Filed: May 12, 2004

(65) Prior Publication Data

US 2005/0253093 A1    Nov. 17, 2005

(51) Int. Cl.  
*H01J 37/07* (2006.01)
(52) U.S. Cl. ............................ 250/492.2; 250/491.1
(58) Field of Classification Search .............. None  
See application file for complete search history.

(56) References Cited

U.S. PATENT DOCUMENTS

| | | | |
|---|---|---|---|
| 3,900,760 A | 8/1975 | Glenn, Jr. et al. | |
| 4,163,155 A | 7/1979 | Alles et al. | |
| 4,438,557 A | 3/1984 | Parker et al. | |
| 4,694,178 A | 9/1987 | Harte | |
| 4,963,748 A | 10/1990 | Szilagyi | |
| 4,974,736 A | 12/1990 | Okunuki et al. | |
| 5,003,178 A | 3/1991 | Livesay | |
| 5,036,195 A | 7/1991 | Batey et al. | |
| 5,414,267 A | 5/1995 | Wakalopulos | |
| 5,760,960 A | 6/1998 | Lin et al. | |
| 5,989,983 A | 11/1999 | Goo et al. | |
| 6,014,200 A | 1/2000 | Sogard et al. | |
| 6,042,994 A | 3/2000 | Yang et al. | |
| 6,057,251 A | 5/2000 | Goo et al. | |
| 6,080,526 A | 6/2000 | Yang et al. | |
| 6,122,599 A | 9/2000 | Mehta | |

(Continued)

FOREIGN PATENT DOCUMENTS

WO    WO 01/52296 A1    7/2001

(Continued)

OTHER PUBLICATIONS

Miniaturized E-Beam Writer:Testing of Components; C. Stabler et al.; Microelectronic Engineering 27 (1995) 155-158; Elsevier Science B.V. SSDI 0167-9317(94)00078-6.

(Continued)

*Primary Examiner*—Nikita Wells  
*Assistant Examiner*—James J. Leybourne  
(74) *Attorney, Agent, or Firm*—Emrich & Dithmar LLC

(57) ABSTRACT

A maskless, direct write electron lithography apparatus for accurately and simultaneously writing plural sub-micron patterns on a silicon substrate employs plural parallel electron beams with precise X-Y mechanical translation of the substrate to provide low cost, high throughput integrated circuit (IC) fabrication. Plural compact micro electron gun assemblies arranged in an I×J rectangular grid each simultaneously expose one IC pattern on the substrate, with each electron gun assembly including a K×L array of individually controlled electron guns emitting K×L electron beams. The regular, small spacing between electron beams in each array, i.e., approximately 1 mm or less, requires a correspondingly small X-Y translation of the substrate to write the entire wafer. Each electron gun array includes plural AC blanked cathodes and DC biased plates having plural aligned beam passing apertures. A computer controlled pattern generator synchronized with wafer X-Y translation controls the duration and timing of the cathode blanking signals.

27 Claims, 4 Drawing Sheets

U.S. PATENT DOCUMENTS

| | | | |
|---|---|---|---|
| 6,132,814 | A | 10/2000 | Livesay et al. |
| 6,271,146 | B1 | 8/2001 | Ross |
| 6,356,028 | B1 | 3/2002 | Legagneux et al. |
| 6,369,385 | B1 | 4/2002 | Muray et al. |
| 6,426,615 | B1 | 7/2002 | Mehta |
| 6,593,584 | B1 | 7/2003 | Krans et al. |
| 6,614,035 | B1 | 9/2003 | Hartley |
| 6,617,587 | B1 | 9/2003 | Parker et al. |
| 6,653,645 | B1 | 11/2003 | Chen |
| 6,710,361 | B1 | 3/2004 | Pfeiffer et al. |
| 6,771,012 | B1 | 8/2004 | Ahmed et al. |
| 6,919,574 | B1 * | 7/2005 | Hashimoto et al. .... 250/492.22 |
| 2002/0081863 | A1 | 6/2002 | Shimada et al. |
| 2002/0127871 | A1 | 9/2002 | Akimoto et al. |
| 2002/0142623 | A1 | 10/2002 | Miyajima et al. |
| 2004/0021095 | A1 | 2/2004 | Sohda et al. |

FOREIGN PATENT DOCUMENTS

| | | |
|---|---|---|
| WO | WO 02/25700 A2 | 3/2002 |
| WO | WO 03/025966 A1 | 3/2003 |
| WO | WO 03/048040 A1 | 6/2003 |

OTHER PUBLICATIONS

Electron Beam Technology-SEM to Microcolumn: T.H.P. Chang et al.; Microelectronic Engineering 32 (1996) 113-130; Elsevier Science B.V. SSDI: 0167-9317(95)00366-5.

Microelectronics Advanced Research Initiative; Melari Nano; Technology Roadmap of Nanoelectronics (1999); European Commission IST Programme Future and Emerging Technologies.

Technology Roadmap for Nanoelectronics; Second Edition (Nov. 2000); European Commission IST Programme Future and Emerging Technologies.

International Technology Roadmap for Semiconductors; Lithography (2001 Edition).

Nanolith, A Revisited Concept for Parallel E-Beam Lithography; P. Lagagneux et al.; International Technology Roadmap for Semiconductors (2001 ITRS).

15th International Vacuum Microelectronics Conference; 48th International Field Emission Symposium; Joint conference in Lyon, France (Jul. 2002).

International Technology Roadmap for Semiconductors; Lithography (2003 Edition).

Fabrication & Electrical Characteristics of Carbon Nanotube-Based Microcathodes for use in a Paralled Electron-Beam Lithography System: K.B.K. Teo et al.; Journal Vacuum Science Tech. B. vol. 21, No. 2, Mar./Apr. 2003.

* cited by examiner

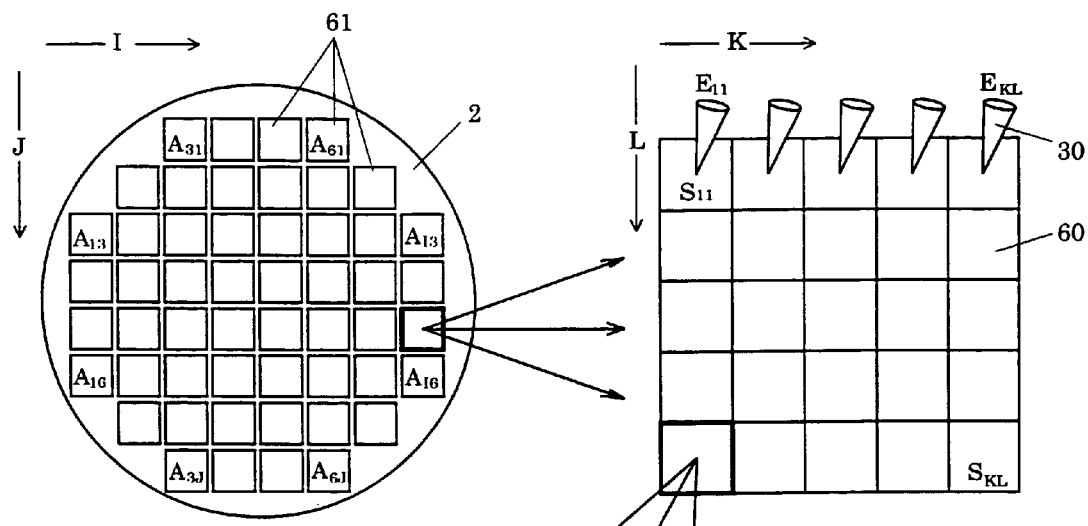
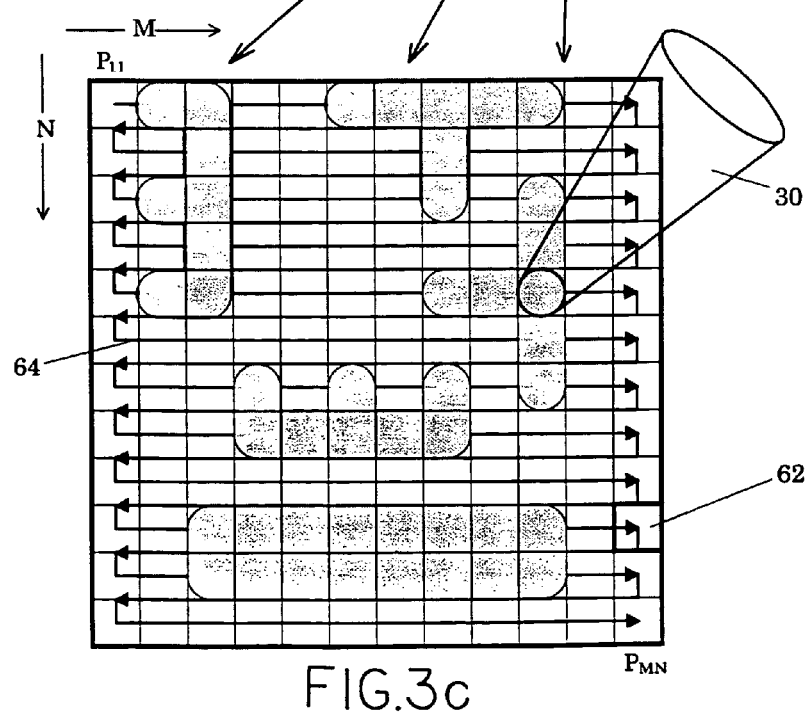

PARALLEL MULTI-ELECTRON BEAM LITHOGRAPHY FOR IC FABRICATION WITH PRECISE X-Y TRANSLATION

FIELD OF THE INVENTION

This invention relates generally to the generation and use of high energy, small cross-sectional particle beams and is particularly directed to the use of these types of electron beams arranged in matrix arrays for use in electron beam lithography such as in the fabrication of integrated circuits (ICs) and the chromium masks used in optical lithography.

BACKGROUND OF THE INVENTION

The fabrication of ICs is accomplished in large volume production by a process called photolithography. Stated simply, this process uses a monochromatic light source of specified wavelength to expose (harden) a photosensitive material covering a silicon wafer. The monochromatic light shines through a chromium stencil (mask) that contains the circuit pattern to be written on the silicon wafer. The shadow of the circuit pattern passes through a complex optical system designed to de-magnify the image and focus it on the silicon wafer. After a short exposure time of about one-quarter to one-half second, the photo-resist chemical hardens effectively transferring the de-magnified image of the mask onto the wafer. The patterns for the various layers of a multi-layer IC are sequentially exposed. The area of a 300 mm diameter wafer is large enough to hold some 176 large scale, 20 mm×20 mm integrated circuit writing fields. With an exposure time on the order of one-quarter to one-half second per IC pattern, the entire wafer can be exposed in 44 to 88 seconds yielding a throughput of approximately 41 to 82 wafers per hour.

The need to improve switching speed and reduce power consumption has driven IC manufacturers to produce ICs with increased component density. This requires increased optical resolution in the photolithography process. It is well known in the manufacture of ICs that the density of components may soon reach a physical limit due to the diffraction effects of light. Diffraction is defined as the apparent bending of light waves around small obstacles and the spreading out of light waves transiting small openings. Diffraction distortion gives rise to a blurring of the shadow of the edge of an object or aperture. In optics, diffraction effects become important when the wavelength of the light used is about the same size as the object being imaged. For example, a standard light optical microscope has a resolving power of approximately 500 nm which is approximately equal to the wavelength of blue visible light. As higher and higher component densities are achieved, the size of individual circuit features decreases. This requires the use of shorter and shorter wavelengths of light to lower diffraction limits. State of the art photolithography machines in use today utilize UV light at a wavelength of 248 nm and employ a costly krypton-fluoride eximer laser as the light source. When combined with phase shifting masks and off-axis optics, the minimum line width that can be written on a wafer is approximately 90 nm. For the next generation of ICs, wavelengths of 193 and 157 nm (extreme UV) such as provided by argon-fluoride lasers will be used to provide line widths possibly down to 45 nm. However, the use of these wavelengths may not be practical due to problems arising from the opaqueness of the conventional glass materials making up the optical lenses. More exotic and costly materials, or the use of totally reflective optics, may be necessary. At a wavelength of 193 nm and below, immersion optics may be used in photolithography equipment to provide additional improvement in resolution. In immersion optics, the air space between the final objective lens and the silicon wafer is replaced by a liquid, such as water, having a higher index of refraction. Since the diffraction limit is also a function of the difference in index of refraction between optical elements and the surrounding medium, immersion optics gives rise to an additional level of improvement in resolution. However, this approach requires resolving not only the opaqueness problem, but also the additional problems associated with a liquid in contact with the silicon. As the wavelength of the incident radiation approaches the X-ray spectrum of approximately 20 nm, standard optical materials will no longer refract or reflect X-rays in the usual manner since the lens materials are now highly transparent at these shorter wavelengths. X-ray lithography devices may be required to use proximity printing techniques which forces the wafer to be in very close proximity to the mask. These difficulties have become technologically insurmountable as well as cost prohibitive.

A well known method for overcoming the diffraction limits associated with the photolithographic process involves replacing the UV light with an electron beam to write the IC pattern. Although the electron has an associated quantum wavelength, it is much shorter than the wavelength of even deep UV light or X-rays and will not cause a diffraction problem even at the 35 nm line width needed in the future. For lithography, the resolution limit for an electron beam is likely not due to its inherent diffraction limit, but rather is due to electron scattering in the resist material and is estimated to be approximately 10 nm. This is well below that needed for the foreseeable future of IC devices. Conventional electron beam lithography devices generally consist of a single electron beam that is focused and magnetically scanned across the silicon wafer. By turning the electron beam on and off at the appropriate time, the IC pattern can be formed much like the video image produced by scanning an electron beam across the phosphor screen of a cathode ray tube (CRT). The electron optics in these devices are very complex and similar to the beam columns of electron microscopes. Indeed, many e-beam lithography machines are modified electron microscopes. Although these electron beam devices have the ability to focus the electron beam spot far smaller than that needed for IC production, they suffer from three major problems, i.e., low throughput, high beam deflection sensitivity, and spot size enlargement due to deflection distortion. It can be easily calculated that the dwell time of an electron beam required on each pixel of an IC pattern is on the order of $1 \times 10^{-7}$ seconds for proper exposure of the electron resist. The next generation of IC patterns will have a feature size approaching 65 nm or a resolution of 15,384 lines per mm ($6.0 \times 10^{10}$ total pixels in a 16 mm×16 mm IC). This translates to a total writing time on the order of two hours per layer of the IC pattern. In addition, the electron beam column used in conventional systems is very large in size such that only one such column can fit over the area of the wafer and only one chip pattern can be written at a time. Thus, the time to form the roughly 176 ICs on a 300 mm diameter wafer is on the order of several days. This is obviously not compatible with the 41 to 82 wafer/hr level of throughput needed for production. The second problem faced by conventional electron beam writing devices is that of beam positioning. Since the scale of the smallest feature for next generation ICs will be on the order of 65 nm, the positioning accuracy of the electromagnetic scan must be on the order of 10% of the line width, or about 6 nm, in order to guarantee vertical alignment of subsequent IC layers. In these conventional devices the positioning of the beam is controlled by an electromagnetic and/or electro-static deflection system that requires extremely accurate control of voltages and currents. This is a difficult task that can be easily disturbed by external electric or magnetic fields.

OBJECTS AND SUMMARY OF THE INVENTION

Accordingly, it is an object of the present invention to provide a mechanically driven multi-beam electron lithography (MDMBEL) apparatus for IC fabrication that alleviates the problems of low throughput and high beam deflection sensitivity.

Another object of the present invention is to provide for the high-speed, large scale fabrication of ICs by means of stationary beams of energetic particles directed onto a silicon substrate without the use of a mask.

A further object of the present invention is to provide for the simultaneous fabrication of plural ICs located on a silicon substrate by directing plural spaced energetic beams onto the substrate and displacing the substrate and controlling the operation of each of the beams in accordance with the IC design.

A still further object of the present invention is to provide a high throughput, low cost, efficient arrangement for the production of ICs wherein plural, parallel, closely spaced energetic particle beams are directed onto a silicon wafer and the wafer is linearly translated a very short distance on the order of the distance of the inter-beam spacing while the beams are individually controlled for tracing out a sub-micron circuit pattern.

It is still another object of the present invention to form an IC on a silicon wafer by directing plural spaced, fixed, parallel particle beams each having a cross section on the order of the required spatial resolution of the IC onto the wafer and displacing the wafer while turning the beams on and off in accordance with the IC pattern.

It is another object of the present invention to provide an MDMBEL device that is very small in size so that many such devices can fit on a wafer to simultaneously write a large number of individual IC patterns.

A further object of the present invention is to provide an MDMBEL device that is inexpensive to manufacture compared to current photolithography exposure equipment or electron beam lithography exposure equipment.

A still further object of the present invention is to provide an MDMBEL device that uses ultra high precision piezoelectric mechanical X-Y translation tables instead of an electromagnetic scan.

Yet another object of the present invention is to provide an MDMBEL device such that the distance needed for the mechanical translation of an IC wafer is on the order of the spacing between electron beams used to form the IC patterns on the wafer.

Still another object of the present invention is to provide an MDMBEL device that utilizes multiple, closely spaced electron beams arranged in a compact, rectangular array.

Another object of the present invention is to provide an MDMBEL device that uses conventional electron optics design and cathodes.

It is yet another object of the present invention to provide an MDMBEL device wherein the IC pattern is stored in computer software eliminating the need for costly mask sets.

Another object of the present invention is to provide an MDMBEL device wherein the step size for the X and Y piezoelectric linear stages is under software control.

The purpose of this invention is to provide a low cost, thumbnail-sized electron beam lithography apparatus that alleviates the problems of low throughput and high magnetic deflection sensitivity that prevent current e-beam lithography machines from being used in high volume production. This invention employs a large number of stationary micro column electron guns (MCEG) arranged in an K×L array extending over the length and width of each IC circuit pattern that is to be written on the wafer. Because the footprint of the array is approximately equal to the size of the IC pattern, many such MCEG arrays can fit within the circular area of the silicon wafer. In the invention, one MCEG array will be used to write one IC pattern on the wafer and all the MCEGs will write simultaneously. In conventional electron beam lithography machines, the IC circuit pattern is written by magnetically scanning an electron beam across a stationary silicon wafer. The present invention uses a novel reverse approach wherein the silicon wafer is physically moved by a set of orthogonal, high precision, piezoelectric linear stages disposed under the stationary electron beams. The silicon wafer is mechanically translated in the X and Y directions in a serpentine scan pattern while the individual electron beams are pulsed on and off by precise computer control synchronized with the position of the wafer. The computer control system contains stored IC pattern information that controls the timing of the electron beam pulses in accordance with the X-Y position of the wafer such that any circuit pattern can be written. The maximum travel of the silicon wafer in either the X or Y direction is very small and is approximately equal to the spacing between adjacent electron beams. For example, to write a 16 mm×16 mm circuit pattern with an array of 16×16 beams, the maximum displacement of the wafer need only be 1 mm in both the X and Y directions. Each of the 256 electron beams in the array writes a 1 mm×1 mm sub-field of the IC pattern, where each sub-field can be thought of as an M×N array of pixel elements. One pixel element has a size equal to the smallest feature to be drawn on the wafer. The time required to write one sub-field of the IC pattern is simply the product of the time to mechanically scan one line of the sub-field times the number of lines in the sub-field. Currently available (off the shelf) piezoelectric linear stages are capable of a displacement velocity of 100 mm/sec with a positional accuracy as small as 1 nm. Thus, the time to scan a 1 mm×1 mm sub-field at a resolution of 15384 lines/mm (65 nm resolution) is 154 seconds (15384/100). With 256 individually controlled beams simultaneously writing their individual sub-fields, the complete IC pattern is written in the same time, or 154 seconds. Since one MCEG array can be fitted for each IC pattern on the silicon wafer and all the MCEGs are driven simultaneously, the entire wafer can be written in the time it takes to write one sub-field and with only a 1 mm by 1 mm motion of the wafer. Therefore, the entire wafer is written in approximately 154 seconds or approximately 23 wafers per hour. Thus, high throughput approaching that of optical lithography is realized. This technology is applicable to an even smaller line width of 35 nm simply by modifying the electron optics in the micro column to produce a 35 nm beam diameter and reducing the pixel size (piezo-motor step size) to 35 nm. In this case, the throughput expected would be approximately 12 wafers per hour (28571 lines/mm, $2.1 \times 10^{11}$ pixels, 286 seconds/sub-field or about 12 wafers/hour). In any of the above mentioned line widths, it may be necessary to reduce the pixel size in the vertical Y direction to some fraction of that in the X direction to allow for beam overlap when writing continuous features that extend in the Y direction. This would reduce the throughput somewhat. Since these devices would be relatively low in cost compared to current optical lithography equipment, several multi-beam steppers could be run simultaneously to equal or surpass the throughput of current optical lithography devices. The problem of electromagnetic deflection sensitivity is essentially non-existent since the beams are held stationary and the wafer is moved by mechanical means while disposed under the beams. In addition, the electron beam travel distance to the wafer is only on the order of a few millimeters compared to the tens of centimeters typical in conventional e-beam lithography columns. Thus, deflection of the electron beam by any external fields is much less likely. Because of its small size and low cost, each MCEG array can be considered a throw-away/replaceable item.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 3*a* is a top view of a silicon wafer showing its circular area divided into a rectangular array $A_{IJ}$ of IC circuit pattern regions, where one MCEG array is positioned 1 mm above each region;

FIG. 3*b* is a magnified view of a single IC region as shown in FIG. 3*a* illustrating this IC region divided into a rectangular array $S_{KL}$ of sub-fields each having an associated electron beam, where one electron beam of the MCEG array is associated with and writes one sub-field;

FIG. 3*c* is a magnified view of one sub-field as shown in FIG. 3*b* illustrating this smaller IC region divided into a rectangular array $P_{MN}$ of pixel elements with its associated electron beam writing circuit features, where the size of each pixel element is equal to the smallest line width required for the circuit pattern feature.

DETAILED DESCRIPTION OF THE PREFERRED EMBODIMENTS

The following discussion assures that 176, 16 mm×16 mm IC circuit patterns are to be written on a silicon wafer that is 300 mm in diameter using a line width of 65 nm. The concept discussed in the following paragraphs, however, is applicable to any size wafer, IC pattern size and resolution within the scope of the device.

Figure 1:
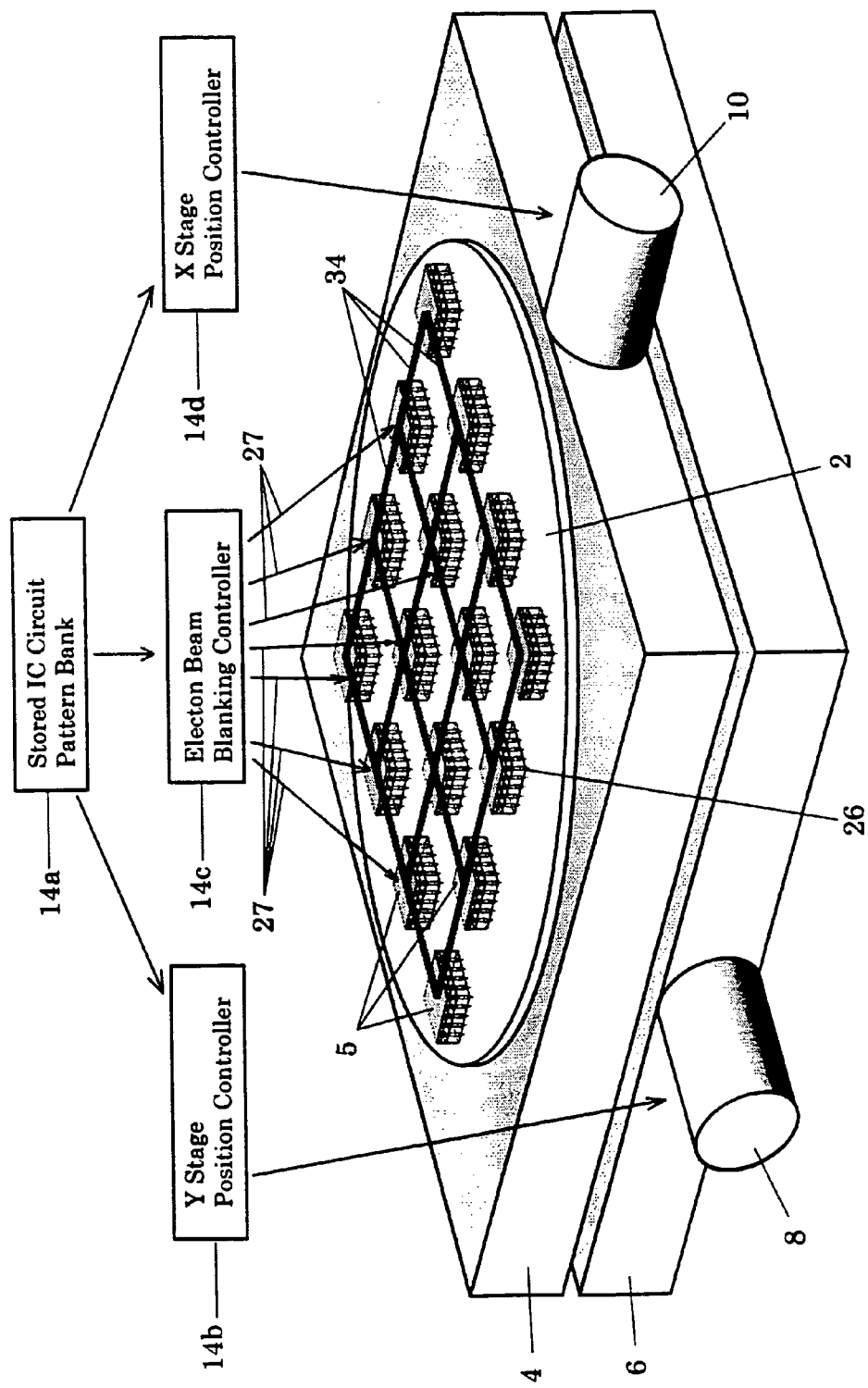
FIG. 1 is a conceptual illustration of a multi-gun lithography system according to the present invention including precision piezoelectric translation stages and motors, an array of multi-column electron gun (MCEG) arrays, and an electron beam blanking and position controller for use with a silicon wafer.

Referring to FIG. 1, there is shown a conceptual illustration of the 176 MCEG arrays 5 arranged in a rectangular array $A_{IJ}$ across the circular area of a silicon wafer 2 in accordance with a preferred embodiment of the present invention. For reasons of clarity, FIG. 1 does not show all 176 MCEGs as it is a conceptual drawing. The MCEG arrays 5 are spaced every 20 mm in the X and Y directions to allow for about 4 mm of space on each side of an array to accommodate a support frame 34 and electrical connections. Support frame 34 is secured to the framework of the stepper device so that the MCEGs are held in a permanently fixed position with the last electrode plate 26 held approximately 1 mm above the wafer. Silicon wafer 2 is secured to a first X-motion high precision piezoelectric linear stage 4 that is itself secured to a second orthogonal Y motion high precision piezoelectric linear stage 6. Thus, with proper activation of the X stage motor 10 and Y stage motor 8, wafer 2 can be moved to any location in the XY plane. Position controllers 14*b* and 14*d* control the stepping of the motors such that the silicon wafer moves in a serpentine scan pattern. A serpentine scan pattern (see FIG. 3*c*) is preferred because it is simple and direct. However, in certain regions of the IC pattern, a vector scan method may provide more efficient motion of the wafer. Currently available (off the shelf) piezoelectric linear stages are capable of achieving 1 nm position accuracy. This is sufficient for the 6 nm positioning resolution required for alignment of vertical layers in the 65 nm line width generation of ICs and is capable of achieving the 3 nm accuracy which will be required for the 35 nm line width IC devices of the future.

Figure 2:
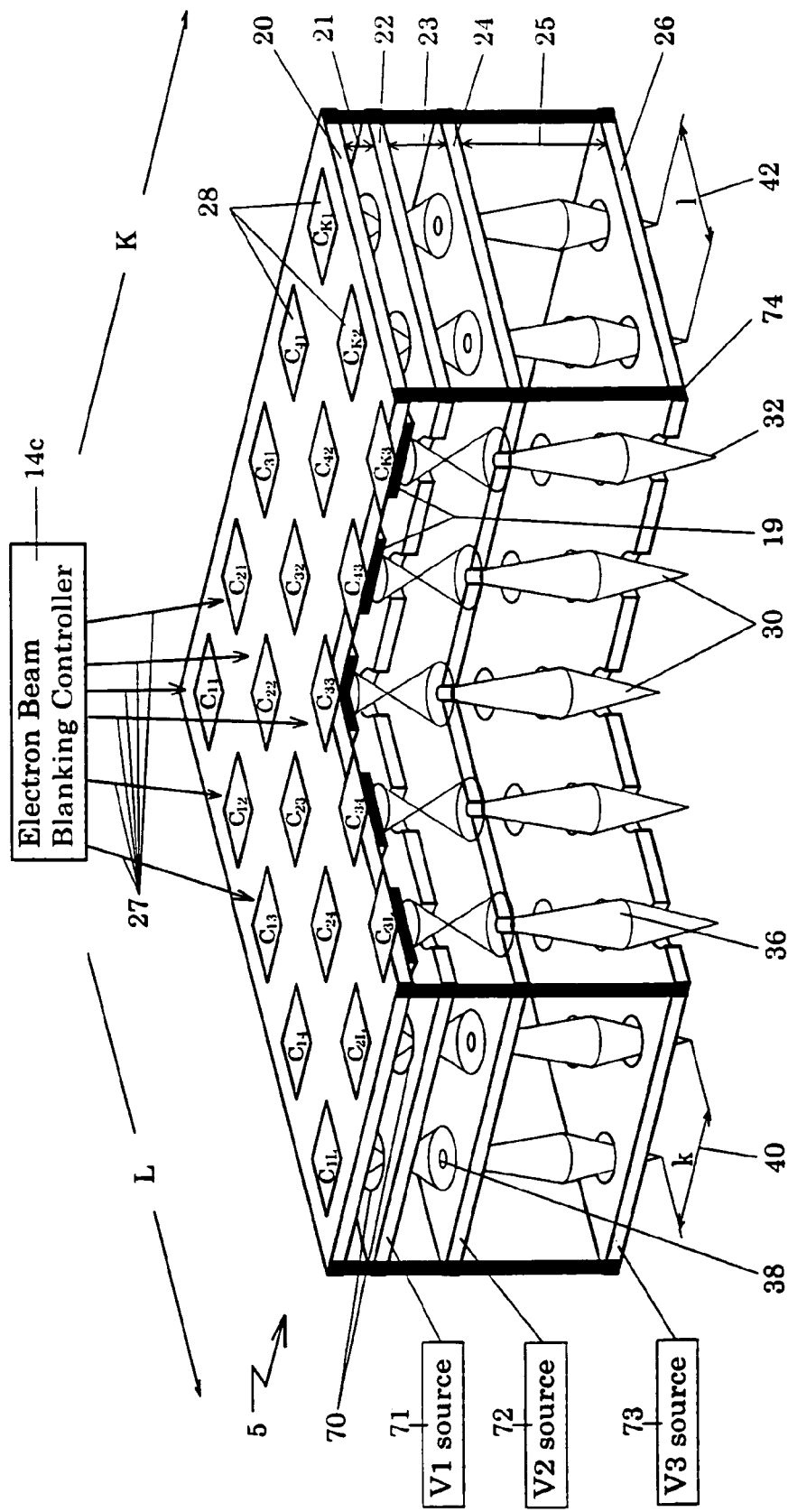
FIG. 2 is a conceptual illustration of a portion of a single multi-column electron gun (MCEG) array including plural 5×5 arrays of electron beams shown for simplicity because the preferred embodiment will likely have a 16×16 array of beams.

The construction of an MCEG array 5 is depicted in FIG. 2 in partially cutaway form. The array is similar in construction to the lower end, or beam forming region, of a typical inline electron gun employed in a color cathode ray tubes. In the CRT electron gun three electron beams are emitted from three individually controlled cathodes spaced approximately 6 mm apart along a horizontal line. The three independent beams are then accelerated and focused by circular apertures formed in a series of plate electrodes that are common to the three beams. The beams then emerge from the last anode electrode aperture and are focused some distance away. In the typical CRT electron gun, the potentials and geometry of the grids are adjusted to focus the beams a distance within the range of 150 and 400 mm beyond the last beam passing aperture. The electron beams of the MCEG array however will be required to have a very short focus distance of approximately 1 mm beyond the last apertured plate. This short focus distance can be accomplished with the proper design of electrodes and the application of appropriate potentials to these electrodes. This common electrode plate concept can be expanded from the inline color CRT gun containing 3 beams spaced 6 mm apart to a larger version with 256 beams spaced 1 mm apart and arranged in a 16×16 array.

FIG. 2 shows the MCEG array 5 producing a rectangular array $E_{KL}$ of electron beams 30 that are focused by an objective lens 36 to a spot 32 on the silicon wafer (not shown for simplicity). In the preferred embodiment, the MCEG structure consists of a top insulating cathode plate 20 supporting and electrically insulating a 16×16 array of 256 cathodes. An electron beam blanking controller 14*b* controls the voltage applied to each of the 256 cathodes through data lines 27 and cathode terminal pads 28. Spaced a distance 21 below the insulating cathode plate 20 is a gate electrode aperture plate 22 with a 16×16 array of gate apertures 70. Gate electrode aperture plate 22 is charged to a potential V1 by a first DC voltage source 71. Spaced a distance 23 below the gate electrode aperture plate 22 is an accelerating plate 24 also containing a 16×16 array of small beam limiting apertures 38 and charged to a potential V2 by a second DC voltage source 72. Also connected to DC voltage source 72 is objective lens aperture plate 39 containing a 16×16 array of objective lens apertures 35 (shown in FIB. 4). The final aperture plate in the MCEG array is an anode plate 26 also with a 16×16 array of anode apertures and spaced a distance 25 below the objective lens plate 39. Anode plate 26 is charged to a final accelerating voltage V3 by a third DC voltage source 73 forming objective lens 36 which focuses and accelerates the electrons to the required kinetic energy for proper exposure of the electron resist. The complete electrode structure of the MCEG array is held together by insulating support columns 34 (partially shown). The cathodes, gate apertures, accelerating apertures and anode apertures in the 16×16 array are accurately centered distance k apart in the X direction 40 and are centered distance l apart in the Y direction 42. In the preferred embodiment, the beam spacing distances k and l are equal and have a value of 1 mm. In addition, the cathodes, gate apertures, accelerating apertures and anode apertures associated with each of the 256 beams are maintained in tight axial alignment by the support structure described above.

Perhaps the most important aspect of the described invention is the method used to simultaneously write 176 complete IC patterns on the wafer. Referring to FIG. 3a the area of the silicon wafer 2 is shown divided up into a rectangular array $A_{IJ}$ of elements 61 each representing the area required for one IC circuit pattern. One MCEG gun array 5 shown in FIG. 2 covers the total rectangular area of one IC pattern or one (1) element 61 shown in FIG. 3a. Referring to FIG. 3b, one IC pattern is shown further divided into a rectangular array $S_{KL}$ of sub-fields 60 such that each sub-field is written by a corresponding electron beam 30 of the MCEG array located directly above the sub-field. In other words, sub-field $S_{KL}$ is completely written by just one electron beam $E_{KL}$. In the preferred embodiment, the size of a sub-field is 1 mm×1 mm. As shown in FIG. 3c, a sub-field is further divided into a rectangular array $P_{MN}$ of pixel elements 62. One pixel element is equal in size to the smallest line width required for the pattern, 65 nm in the described example. During the writing of a sub-field, the wafer is stepped under the electron beams in 65 nm increments in tracing a serpentine scan pattern 64 as shown in FIG. 3c. Thus, the silicon wafer 2 requires only a maximum displacement of M pixels in the X direction and N pixels in the Y direction to write one complete sub-field. As the silicon wafer 2 is moved under the MCEG array, the 256 electron beams 30 are individually pulsed on and off by software control according to the X and Y position of the wafer so that a distinct independent circuit pattern is formed within each of the 256 sub-fields. The voltage provided by electron beam blanking controller 14c controls the on/off state of each of the 256 electron beams by providing independent bias and blanking signals to each cathode. An electron beam is pulsed so as to expose a single pixel at a time or is turned on for a longer period of time to expose a continuous horizontal line.

Stored within IC circuit bank 14a are the data files that relate the IC circuit pattern with the X, Y pixel position of the wafer as reported by position controllers 14b and 14d. One data file contains the circuit pattern information for one of the 256 sub fields and controls the beam blanking signals sent by beam blanking controller 14c to each of the 256 cathodes. The circuit pattern information for each sub field is stored in the form of a list of the beam blanking condition (on or off) for each pixel in the sub field and listed in sequential order in accordance with the serpentine scan. Thus, the writing pattern for an IC is completely under software control eliminating the requirement for a costly set of photo exposure masks. Because each of the 176 MCEG arrays is writing the same circuit pattern, like positioned cathodes in each array are electrically tied together and receive the same bias and blanking data signals. Thus, cathode $C_{11}$ of $MCEG_{11}$ is electrically tied to and run in parallel with cathode $C_{11}$ of $MCEG_{21}$ which is electrically tied to and run in parallel with cathode $C_{11}$ of $MCEG_{31}$, and so on. It is important to realize since there are K×L beams per MCEG array and there are I×J MCEG arrays per wafer, all 176 IC circuit patterns can be written by moving the silicon wafer no more than the 1 mm span of a sub-field and within the time to scan one sub-field. In other words, the preferred embodiment has 176×256, or 45056, electron beams writing simultaneously as the wafer is displaced 1 mm in the X and Y directions.

Figure 4:
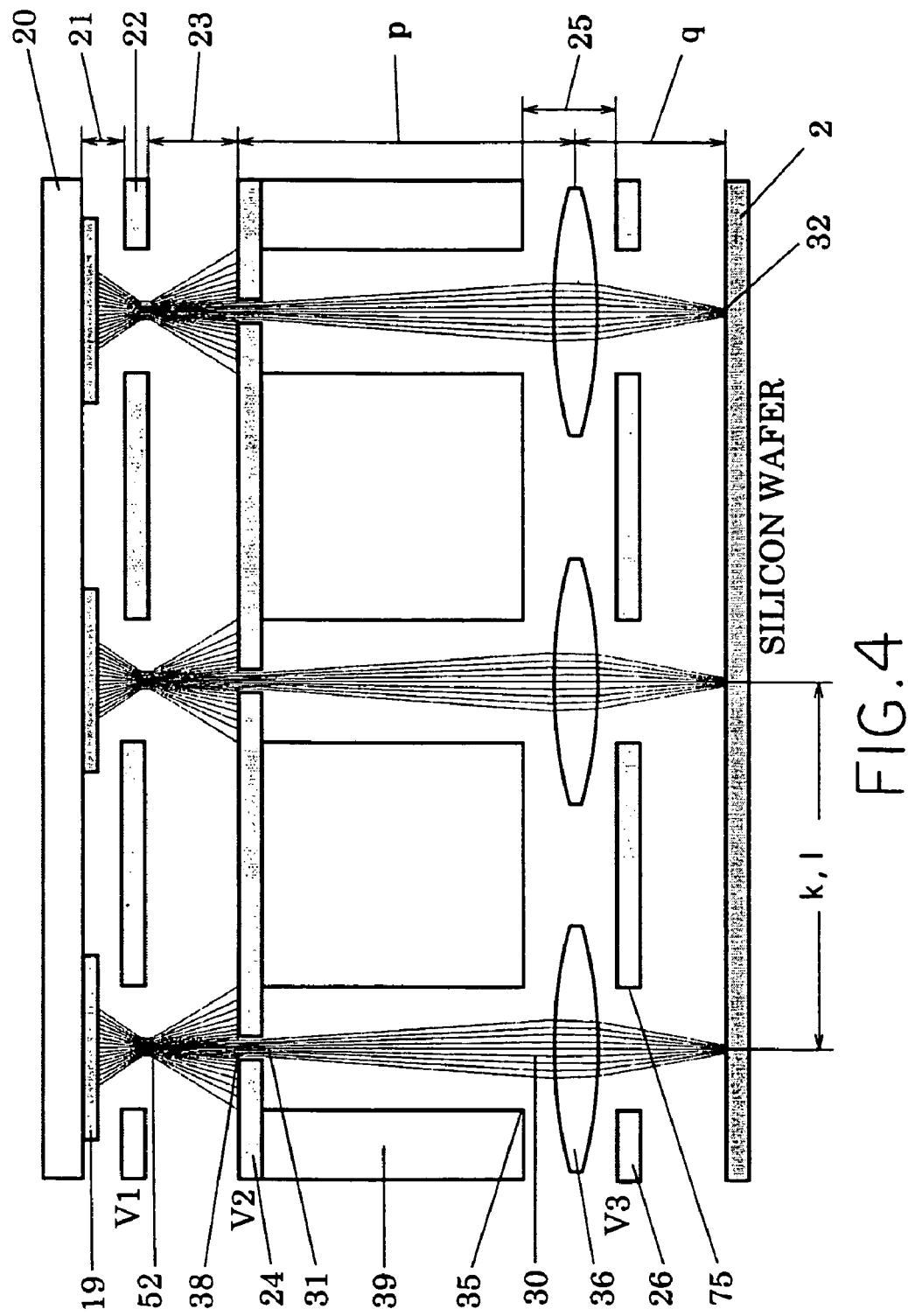
FIG. 4 is a conceptual sectional view of a portion of an MDEG array showing the details of the electron optics used in the MCEG including a cathode emitter, a gate electrode, limiting aperture and focus electrodes and an anode electrode.

Details of the electron optics for a micro column electron gun used in the present invention are shown in the simplified sectional view of FIG. 4. Computer simulations of such a gun operating at an approximate anode voltage of 25 KV indicates that the required 65 nm diameter focused electron beam spot 32 can be realized with a structure disposed within a 1 mm diameter by 10 mm long cylinder. As shown in FIG. 4, electrons are emitted from a cathode 19 when an accelerating electric field at the cathode surface is of sufficient strength for electron emission to occur. The voltage difference between cathode 19 and gate electrode plate 22 controls the electric field strength at the cathode surface. Electron beam blanking controller 14b provides a range of voltage to cathode 19 such that the electric field ranges from a negative value corresponding to a blanked beam condition to a positive value wherein the beam current emitted by the cathode is sufficient to properly expose the electron resist. Because the required time is on the order of $1\times10^{-7}$ seconds, the bandwidth required for cathode blanking is approximately 10 Mhz which is well within the operating range of simple electronic amplifiers. Emitter cathode 19 will likely be of the cold field emission type that operates at room temperature and does not dissipate heat into the surrounding structure. A thermionic type of cathode emitter may be used if the heat generated remains sufficiently low such that thermal expansion of electrode plate elements is not a problem. A differential in thermal expansion of adjacent electrode plates could cause an undesirable shift in beam position due to misalignment of beam passing apertures. Once the beam is emitted toward gate electrode plate 22, the convergent action of the electric field forces the electron beam through a crossover 52, resulting in an expanding conical beam incident on limiting aperture 38. Depending on the type of cathode used and the design of the electron optics, the electron beam can form a crossover 52 or simply emerge from the cathode as a diverging conical beam without crossover. Limiting aperture 38 then removes the outer portion of the electron beam leaving only the high quality, high current density center portion of the beam to pass through the limiting aperture. In the preferred embodiment, the diameter of limiting aperture 38 is approximately 1000 nm. The narrow angle electron beam transiting limiting aperture 38 then forms an electron object 31 equal in size to limiting aperture 38 which is then demagnified and projected on the silicon wafer 2 by means of an objective lens 36. Objective lens 36 is formed between the apertures 35 of the objective lens plate 39 and the apertures 75 of anode plate electrode 26 by the focusing electric field created by the difference in voltage sources V2 and V3. While maintaining the anode voltage V3 constant, the focal length q of the objective lens 36 is controlled by varying the focus voltage V2 applied to the limiting aperture electrode plate 24. Thus, the required focal, or image, distance q of objective lens 36 is achieved by proper setting of voltage V2. Because the required size of the focused electron beam spot 32 must be 65 nm, objective lens 36 should have a magnification value M of $^{65}/_{1000}$ or 0.065. In electron optics theory the magnification of a sample two cylinder lens can be expressed by equation (1) as follows:

$$M=(q/p)sqrt(V2/V3), \quad (1)$$

where:
q is the image (focal) distance (=1 mm);
p is the object distance;
V is the focus voltage (=3000 Volts); and
V3 is the final anode or accelerating voltage (=25000 Volts).

Using the above computer derived voltages with an image distance q, of 1 mm, equation (1) requires an object distance p of approximately 5.3 mm to achieve a magnification of 0.065. The total length of the described micro column electron gun is given by the sum of spacings 21, 22, 23, p and q yielding an electron gun length of approximately 7–8 mm.

The last characteristic of an electron beam used in the present invention to be discussed is the beam current required for proper exposure of the electron resist material. The level of exposure is determined by the total charge in micro coulombs that is deposited on a square centimeter of the resist area. Standard electron resist materials presently used in electron beam lithography require a charge of approximately 200 uC/cm$^2$ for complete exposure. The beam current I required to deposit 200 uC/cm$^2$ of charge with an electron beam diameter D over an exposure time T per pixel is given by equation (2) as follows:

$$I=200\times10^{-6}*\pi(D/2)^2/T \quad (2)$$

Using a pixel time T of 6.5×10–7 sec (derived from the linear stage velocity of 100 mm/sec) and a beam diameter D equal to the pixel size, or 65 nm, a 1.02×10$^{-8}$ Ampere beam current I is required to properly expose the resist. This is the beam current that must pass through the limiting aperture and be focused to a 65 nm diameter spot on the silicon wafer.

While particular embodiments of the present invention have been shown and described, it will be obvious to those skilled in the relevant arts that changes and modifications may be made without departing from the invention in its broader aspects. For example, variations in the design of the mechanical scan displacement arrangement, the MCEG array, the electron beam scan pattern and electron optics described herein are possible in carrying out the present invention. Thus, any such variations are within the scope and spirit of the broad concept and implementation of the present invention described herein. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for simultaneously forming plural integrated circuit (IC) patterns on a substrate, said apparatus comprising:

plural arrays of particle beam sources arranged in a spaced, planar I×J matrix configuration wherein each of said arrays includes plural particle guns arranged in a spaced, planar K×L matrix array for directing plural parallel beams of energetic particles onto the substrate with the particle beams of each array of particle guns forming a discrete IC pattern, and wherein the closest spacing between adjacent particle guns is k and l along orthogonal X- and Y- axes, respectively;

a beam blanking controller coupled to each of said plural arrays of particle beam sources for controlling the particle beams emitted by each of the particle guns by blanking and unblanking each of said particle beams, wherein a common control signal is simultaneously provided to each of said arrays, said controller further storing a circuit pattern; and X- and Y- position controllers coupled to the substrate and further coupled to said beam blanking controller and responsive to the circuit pattern stored therein for displacing the substrate along said X- and Y- axes while said controller blanks and unblanks each of the particle guns to form plural IC patterns on the substrate, wherein displacement of the substrate along the X- and Y- axes is respectively limited to distances of k and l.

2. The apparatus of claim 1 wherein said particles are electrons and said particle guns are electron guns.

3. The apparatus of claim 2 wherein the electron guns in each of said arrays include electron beam sources each having plural cathodes and plural charged plates disposed between said cathodes and the substrate.

4. The apparatus of claim 3 wherein each of said electron guns includes a respective cathode and means in each of said charged plates defining plural aligned apertures through which the energetic electrons are directed and formed into a beam.

5. The apparatus of claim 4 wherein said cathodes are disposed on a generally flat insulating plate for maintaining said cathodes in said spaced, planar K×L matrix array.

6. The apparatus of claim 5 wherein said charged plates include a gate electrode plate for forming the energetic electrons into beams.

7. The apparatus of claim 6 wherein said charged plates further include an accelerating plate disposed intermediate said gate electrode plate and the substrate and having plural limiting apertures through each of which a respective electron beam is directed for reducing electron beam cross section.

8. The apparatus of claim 7 further including an anode plate for accelerating the energetic electrons to a velocity sufficient for proper exposure of the substrate for forming a circuit pattern thereon.

9. The apparatus of claim 8 further including an objective lens plate forming an objective lens with said anode plate, wherein said objective lens is disposed between said anode plate and said objective lens plate.

10. The apparatus of claim 9 further comprising V1, V2 and V3 voltage sources respectively coupled to said gate electrode plate, to said accelerating and objective lens plates, and to said anode plate, where V3>V2>V1.

11. The apparatus of claim 10 wherein said anode plate is disposed approximately 1 mm from the substrate.

12. The apparatus of claim 11 further comprising a focusing arrangement disposed between said accelerating plate and said anode plate for focusing the electron beams on the substrate.

13. The apparatus of claim 12 wherein said focusing arrangement comprises plural objective lenses disposed between said accelerating plate and said anode plate, wherein each objective lens is aligned with and passes a respective electron beam for focusing the electron beam on the substrate.

14. The apparatus of claim 1 wherein each of said plural arrays of electron beam sources is arranged in a 16×16 matrix configuration.

15. The apparatus of claim 14 wherein each electron beam in each of said arrays writes a 1 mm×1 mm sub-field of an IC pattern.

16. The apparatus of claim 15 wherein the closest spacing between adjacent electron beams in a matrix array of electron beam sources is 1 mm.

17. The apparatus of claim 16 wherein said controller blanks and unblanks each of said electron beams at a rate of 10 MHz.

18. The apparatus of claim 17 wherein an electron beam spot on the order of 65 nm in diameter is formed on the substrate.

19. A method for fabricating integrated circuits (ICs) on an electron-resist bearing silicon substrate comprising the steps of:
arranging energetic particle sources in plural spaced groups in a first closely spaced matrix array;
arranging said energetic particle sources in each group in a second, smaller closely spaced matrix array;
forming the energetic particles from each source in a group into a particle beam having a small cross sectional area, wherein said particle beams are directed in a common direction along parallel, closely spaced axes;
directing said particle beams onto the electron-resist on the silicon substrate with sufficient energy and intensity to form a circuit pattern thereon;
displacing the silicon substrate along orthogonal X- and Y- axes in accordance with said circuit pattern; and
turning each of said particle beams on and off in accordance with said circuit pattern as the silicon substrate is displaced to allow each group of energetic particle sources to simultaneously form an IC on the silicon substrate in accordance with said circuit pattern.

20. The method of claim 19 wherein said energetic particle sources are electron sources and said particle beams are stationary electron beams.

21. The method of claim 20 further comprising the step of reducing the cross sectional area of each of said electron beams to produce a smaller beam spot on the silicon substrate.

22. The method of claim 21 wherein the step of reducing the cross sectional area of each of said electron beams includes directing each beam through a respective limiting aperture of small size.

23. The method of claim 20 further comprising the step of focusing each of said electron beams on the silicon substrate.

24. The method of claim 20 further comprising the step of forming a beam crossover in each of said electron beams for expanding said beams prior to reducing the electron beam's cross sectional area.

25. A method for fabricating integrated circuits (ICs) on an electron-resist bearing silicon substrate comprising the steps of:
arranging energetic particle sources in plural spaced groups in a first closely spaced matrix array;
arranging said energetic particle sources in each group in a second, smaller closely spaced matrix array;
forming the energetic particles from each source in a group into a particle beam having a small cross sectional area, wherein said particle beams are directed in a common direction along parallel, closely spaced axes:
directing said particle beams onto the electron-resist on the silicon substrate with sufficient energy and intensity to form a circuit pattern thereon;
displacing the silicon substrate along orthogonal X- and Y- axes in accordance with said circuit pattern, wherein the silicon substrate is displaced with respect to said electron sources in a manner providing a trace of each electron beam on the silicon and
turning each of said particle beams on and off in accordance with said circuit pattern as the silicon substrate is displaced to allow each group of enernetic particle sources to simultaneously form an IC on the silicon substrate in accordance with said circuit pattern.

26. The method of claim 20 wherein said energetic electron sources in each group are arranged in an K×L matrix array, where K and L are 16.

27. The method of claim 20 further comprising the step of providing a closest spacing of k or l between adjacent electron beams and displacing the silicon substrate a distance approximately equal to k or l in forming plural ICs on the silicon substrate in accordance with said circuit pattern.

* * * * *